(12) United States Patent
Tsuji et al.

(10) Patent No.: US 11,527,426 B2
(45) Date of Patent: Dec. 13, 2022

(54) SUBSTRATE PROCESSING DEVICE

(71) Applicant: TOKYO ELECTRON LIMITED, Tokyo (JP)

(72) Inventors: Norihiko Tsuji, Yamanashi (JP); Atsushi Kawabe, Yamanashi (JP); Hiroki Oka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 136 days.

(21) Appl. No.: 16/496,378

(22) PCT Filed: Mar. 12, 2018

(86) PCT No.: PCT/JP2018/009539
§ 371 (c)(1),
(2) Date: Sep. 20, 2019

(87) PCT Pub. No.: WO2018/173836
PCT Pub. Date: Sep. 27, 2018

(65) Prior Publication Data
US 2021/0111050 A1 Apr. 15, 2021

(30) Foreign Application Priority Data
Mar. 24, 2017 (JP) .............................. JP2017-059814

(51) Int. Cl.
*H01L 21/677* (2006.01)
*H01L 21/67* (2006.01)

(52) U.S. Cl.
CPC .. *H01L 21/67742* (2013.01); *H01L 21/67178* (2013.01); *H01L 21/67196* (2013.01); *H01L 21/67201* (2013.01)

(58) Field of Classification Search
CPC ......... H01L 21/67167; H01L 21/67196; H01L 21/67201
See application file for complete search history.

(56) References Cited

U.S. PATENT DOCUMENTS

| 2009/0162170 A1* | 6/2009 | Yamagishi | ........ H01L 21/67196 414/217 |
| 2013/0068391 A1* | 3/2013 | Mazzocco | ............. F16K 3/0218 156/345.33 |
| 2015/0024671 A1* | 1/2015 | Taniyama | ......... H01L 21/67017 454/193 |

FOREIGN PATENT DOCUMENTS

| JP | 1987-73546 A | 5/1987 |
| JP | H10-107124 A | 4/1998 |

(Continued)

OTHER PUBLICATIONS

PCT International Search Report and Written Opinion, PCT Application No. PCT/JP2018/009539, dated Jun. 12, 2018, 9 pages (with English translation of International Search Report).

*Primary Examiner* — Parviz Hassanzadeh
*Assistant Examiner* — Nathan K Ford
(74) *Attorney, Agent, or Firm* — Fenwick & West LLP

(57) ABSTRACT

A substrate processing device includes a transfer chamber configured to transfer a substrate under an atmospheric atmosphere and a plurality of processing units each including at least one processing chamber for processing the substrate under a vacuum atmosphere and at least one load-lock chamber connected to the processing chamber to switch an inner atmosphere thereof between the atmospheric atmosphere and the vacuum atmosphere. The transfer chamber includes a connection unit configured to connect the transfer chamber and the load-lock chamber such that each of the processing units is detachably attached. The connection unit includes an opening that allows the transfer chamber to communicate with the load-lock chamber, and an opening/closing mechanism configured to open and close the opening portion.

9 Claims, 11 Drawing Sheets

(56) References Cited

FOREIGN PATENT DOCUMENTS

| | | |
|---|---|---|
| JP | 2001-053131 A | 2/2001 |
| JP | 2012-186506 A | 9/2012 |
| JP | 2015-076458 A | 4/2015 |
| KR | 10-2001-0021746 A | 3/2001 |
| KR | 10-0676029 B1 | 1/2007 |
| KR | 20-2014-0001589 U | 3/2014 |
| KR | 10-2015-0091230 A | 8/2015 |

* cited by examiner

SUBSTRATE PROCESSING DEVICE

TECHNICAL FIELD

The present invention relates to a substrate processing device.

BACKGROUND

In a substrate processing device for performing vacuum processing such as film formation, etching, or the like on a semiconductor wafer (hereinafter, referred to as "wafer"), an atmosphere transfer device includes a plurality of processing chambers to perform the vacuum processing while ensuring a high throughput. Further, in the substrate processing device provided with the processing chambers, the processing chambers are separated from the atmospheric transfer device at the time of maintenance.

For example, Patent Document 1 discloses a multi-chamber system including a plurality of processing modules, each having a load-lock chamber and a processing chamber. In the structure shown in FIG. 9 of Patent Document 1, the processing modules are arranged side by side at opposite sides of a wafer transfer device. Further, in the structure shown in FIG. 5 of Patent Document 1, the processing modules are arranged in two stages in a vertical direction of the wafer transfer device.

PRIOR ART

Patent Document 1: Japanese Patent Application Publication No. 2012-186506, FIGS. 5 and 9

However, when the processing module is separated from the atmosphere transfer device at the time of maintenance, particles flow into the atmosphere transfer device from a connection portion between the processing module and the atmosphere transfer device, so that a wafer to be transferred to another processing chamber through the atmosphere transfer device or the processing module where the wafer from the atmosphere transfer device will be processed may be contaminated. Further, it is required to stop the operation of the substrate processing device even when maintenance of merely some of the processing modules is being performed.

In view of the above, the present invention provides a substrate processing device capable of preventing the inflow of particles into the device at the time of maintenance of the processing module and continuing the operation of the substrate processing device even during the maintenance of the processing module.

SUMMARY

In accordance with an aspect of the present invention, there is provided a substrate processing device including: a transfer chamber configured to transfer a substrate under an atmospheric atmosphere; and a plurality of processing units each including at least one processing chamber for processing the substrate under a vacuum atmosphere and at least one load-lock chamber connected to the processing chamber to switch an inner atmosphere thereof between the atmospheric atmosphere and the vacuum atmosphere. Further, the transfer chamber has a connection unit configured to connect the transfer chamber and the load-lock chamber, and each of the processing units is detachably attached to the transfer chamber by the connection unit. The connection unit includes an opening that allows the transfer chamber to communicate with the load-lock chamber, and an opening/closing mechanism configured to open and close the opening.

In accordance with the aspect of the present invention, it is possible to provide the substrate processing device that is capable of preventing the inflow of particles into the device at the time of maintenance of the processing unit and continuing the operation of the substrate processing device while maintenance of the processing unit is being performed.

DETAILED DESCRIPTION

Figure 1:
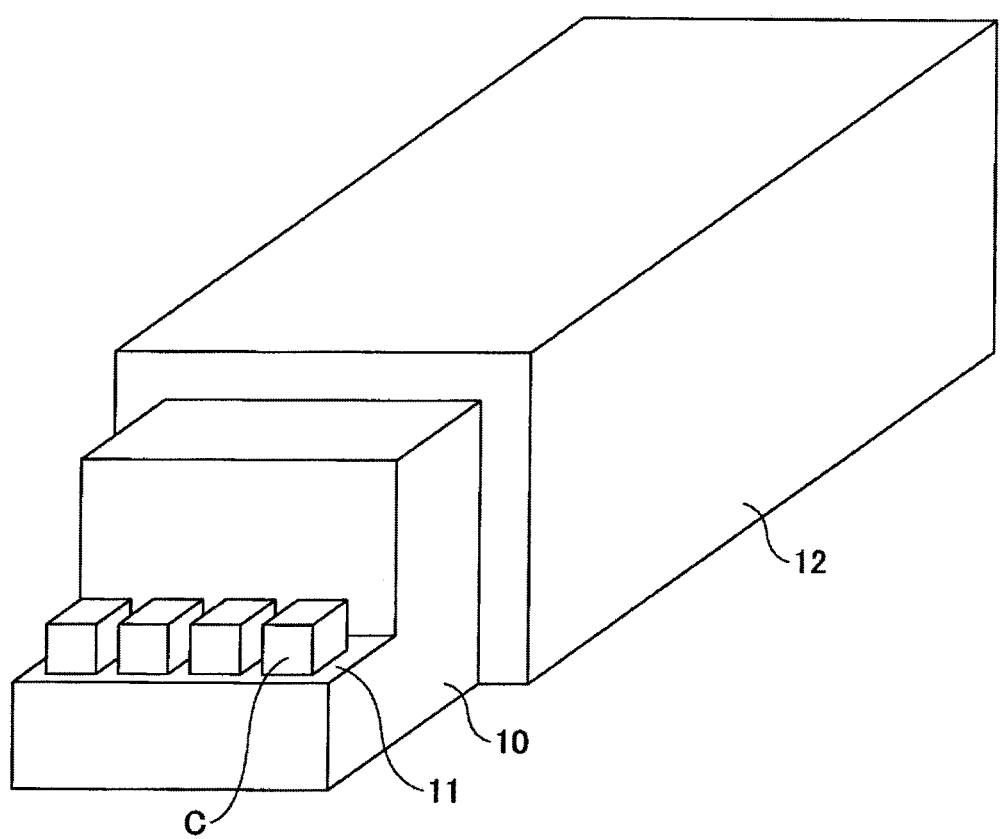
FIG. 1 is a perspective view showing an appearance of a substrate processing device according to an embodiment of the present invention.
Figure 2:
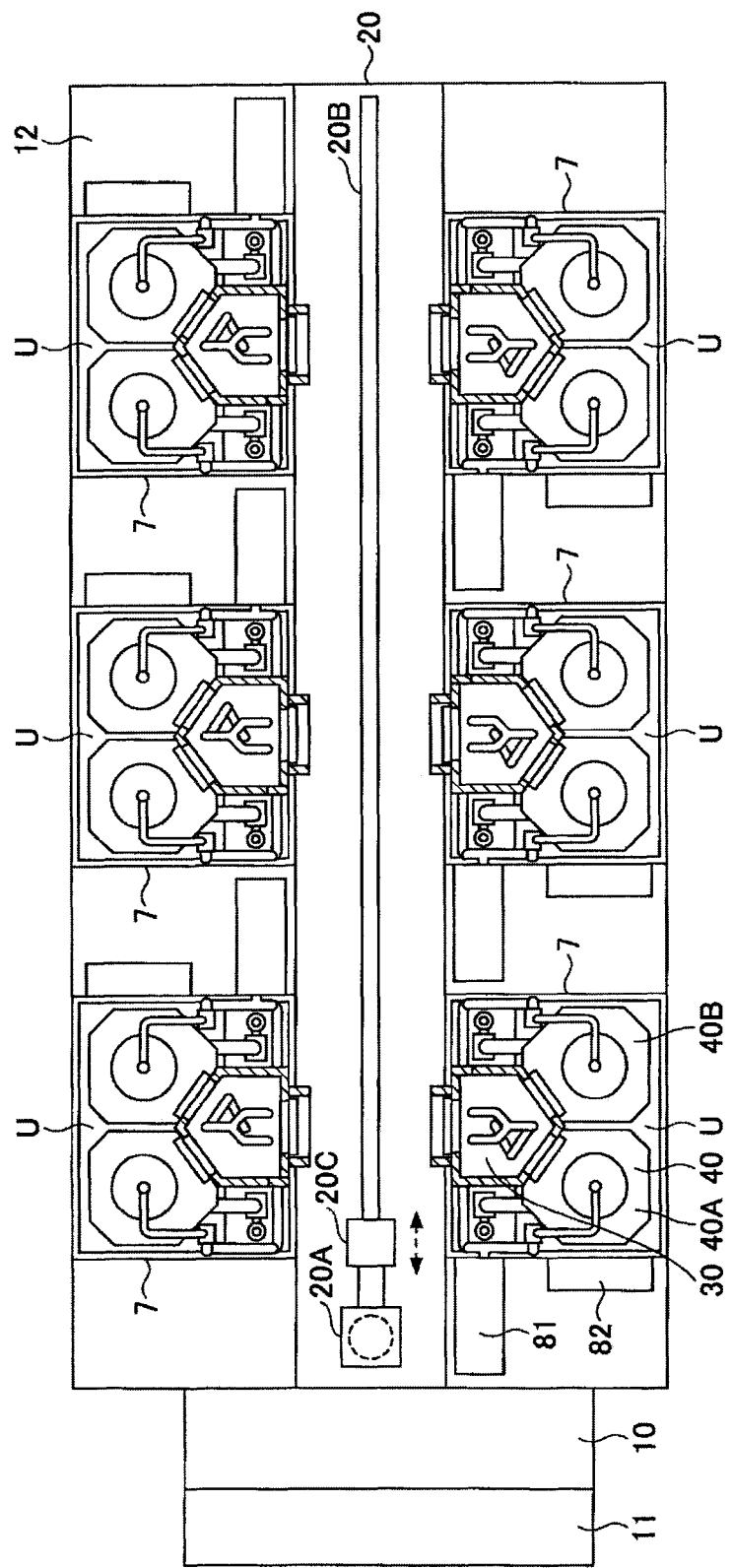
FIG. 2 is a plan view showing the inside of a substrate processing unit of the substrate processing device according to the embodiment.

Hereinafter, a configuration of a substrate processing device according to an embodiment of the present invention will be described with reference to the accompanying drawings. FIG. 1 is a perspective view showing an appearance of a substrate processing device according to an embodiment of the present invention. FIG. 2 is a plan view showing the inside of a substrate processing unit of the substrate processing device according to the embodiment. As shown in FIG. 1, the substrate processing device of the present embodiment includes an equipment front end module (EFEM) 10, a load port 11, and a substrate processing unit 12.

The EFEM 10 includes a load port 11 on which a carrier C as a transfer container accommodating a plurality of substrates (wafers) is mounted. The EFEM 10 is connected to the substrate processing unit 12. The EFEM 10 includes a transfer chamber (not shown) having a transfer mechanism for transferring a wafer from the load port 11 to the substrate processing unit 12. A fan filter unit (not shown) is disposed at a position near an upper surface of the transfer chamber, and the transfer chamber has an inner space under a clean air atmosphere of a positive pressure. The EFEM 10 transfers the wafer received from the carrier C to the substrate processing unit 12 using the transfer mechanism.

Figure 4:
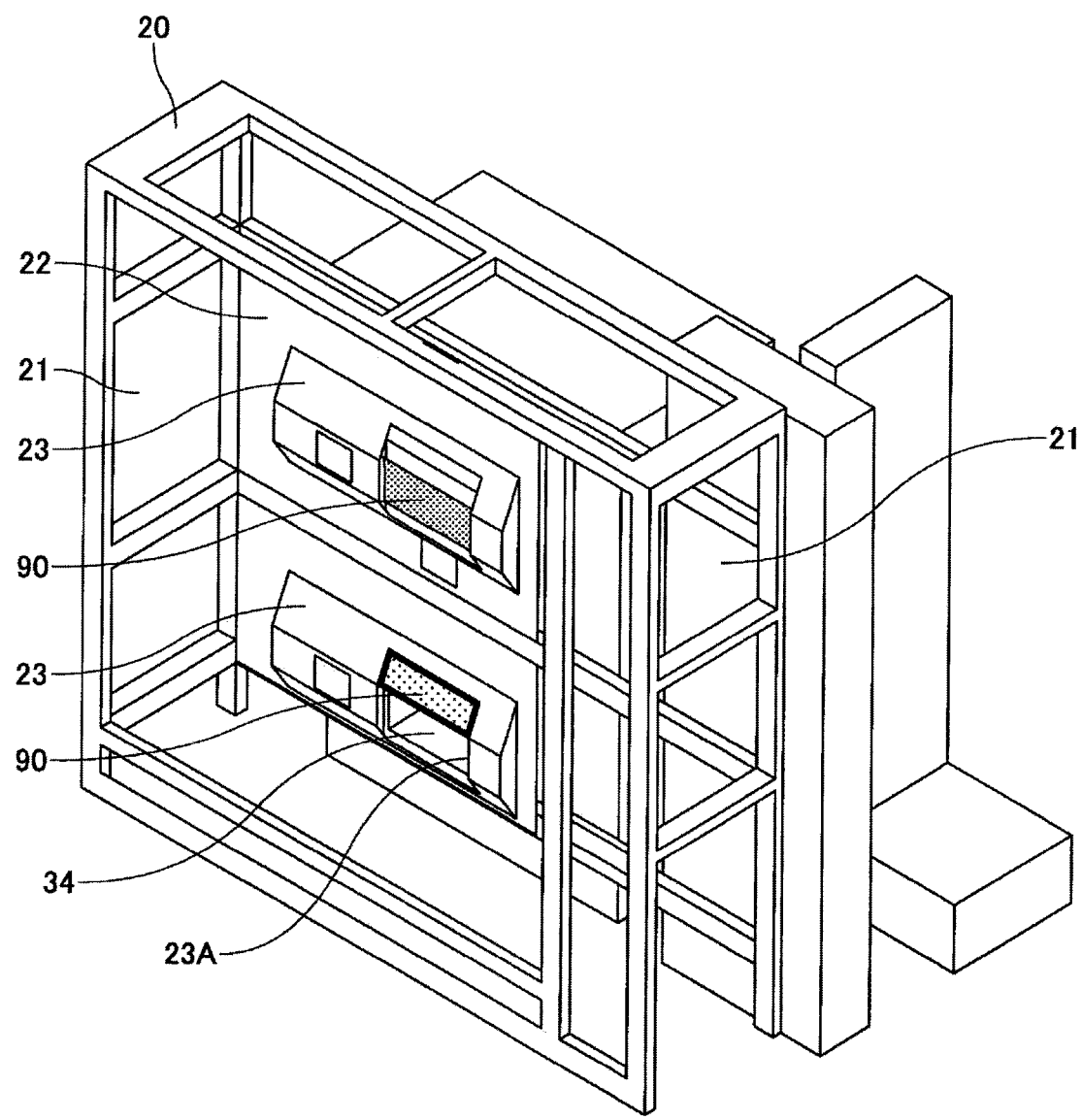
FIG. 4 is a perspective view showing the inside of a transfer chamber of the substrate processing device according to the embodiment.

As shown in FIGS. 2 and 4, the substrate processing unit 12 includes a substrate transfer chamber 20, a plurality of processing units U, and a plurality of connection units 23. The EFEM 10 is connected to one side surface 21 of the substrate transfer chamber 20 in a longitudinal direction of the substrate transfer chamber 20, and the processing units U arranged in multiple stages are connected to opposite side surfaces 22 of the substrate transfer chamber 20 in a direction orthogonal to the longitudinal direction of the substrate transfer chamber 20. The substrate transfer chamber 20, the processing unit U, and the connection unit 23 are respective examples of a transfer chamber, a processing unit, and a connection unit of the substrate processing device of the present invention.

Figure 3:
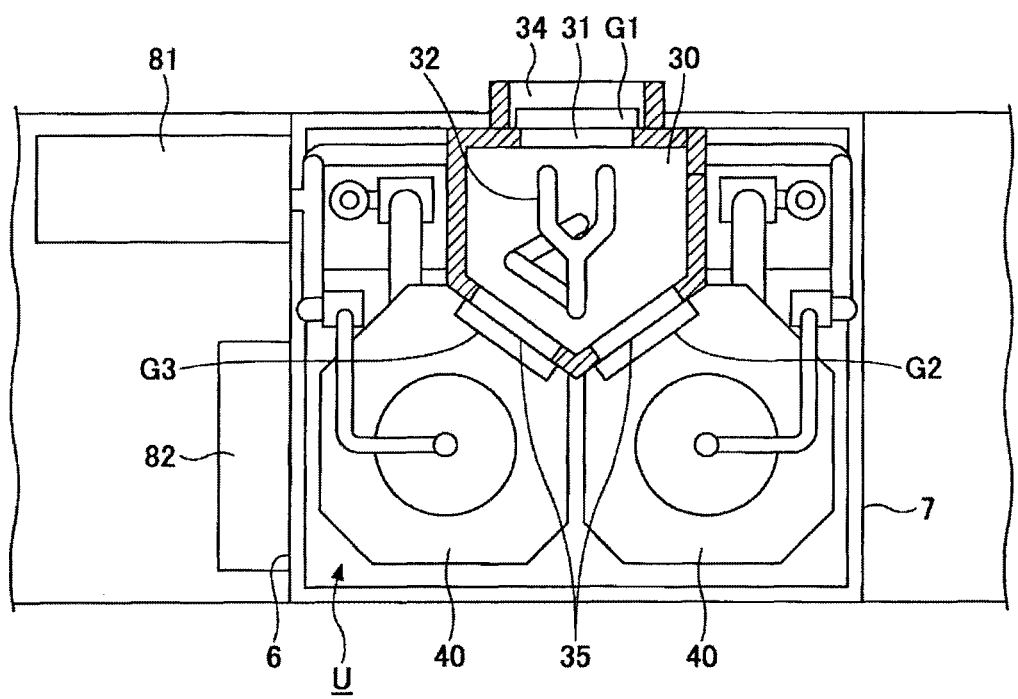
FIG. 3 shows one processing unit of the substrate processing device according to the embodiment.

As shown in FIG. 3, the substrate processing unit 12 further includes an outer frame 7, and the processing unit U is accommodated in the outer frame 7 that is connected to the substrate transfer chamber 20. The substrate transfer chamber 20 and the outer frame 7 are accommodated in the substrate processing unit 12, for example (see, e.g., FIGS. 1 and 9). In the case where the processing units U are arranged in multiple stages, the substrate processing unit 12 has a height that allows the substrate processing unit 12 to be connected to the processing units U arranged in multiple stages.

The substrate transfer chamber 20 transfers the wafer received from the EFEM 10 to the processing units U under an atmospheric atmosphere (positive pressure atmosphere). A fan filter unit F is disposed at an upper surface of the substrate transfer chamber 20, and the substrate transfer chamber 20 has an inner space under a clean air atmosphere of a positive pressure (see, e.g., FIGS. 4, 8A, and 8B).

As shown in FIG. 2, a traveling rail 20B forming a moving path extending along the longitudinal direction of the substrate transfer chamber 20 is disposed at a bottom portion of the substrate transfer chamber 20. Further, in the substrate transfer chamber 20, a support column 20C is movable in a forward/backward direction while being guided by the traveling rail 20B, and a transfer mechanism 20A that is vertically movable along the support column is disposed at a side surface of the support column 20C on the EFEM 10 side.

The substrate transfer mechanism 20A has a structure in which wafer holders (not shown), each holding a single wafer, are provided in multiple stages in a housing having an open front surface. Further, the substrate transfer mechanism 20A is supported by the support column through a rotation driving unit (not shown) that rotates the housing around a vertical axis. With this configuration, the substrate transfer mechanism 20A can allow the opening surface of the housing to be directed toward the EFEM 10 and opposite side surfaces of the substrate transfer chamber 20 where the outer frame 7 is provided.

The substrate transfer mechanism 20A is not limited to only having a structure of the housing accommodating wafers in multiple stages. For example, one or more multi-joint arms capable of extending, contracting, and rotating may be disposed to be movable along the traveling rail and to be vertically movable along the support column. In this case, a shelf-shaped wafer mounting unit for temporarily mounting thereon a wafer to be transferred may be disposed between the EFEM 10 and the substrate transfer chamber 20.

As shown in FIG. 2, a plurality of (three in this example) outer frames 7, each accommodating a processing unit U, are arranged at opposite sides in the longitudinal direction of the substrate transfer chamber 20. The arrangement of the outer frames 7 is not limited to the example shown in FIG. 2. For example, the EFEM 10 may be connected to one surface of the substrate transfer chamber 20 having a polygonal planar shape, and the outer frames 7 may be connected radially to the other surfaces.

Figure 9:
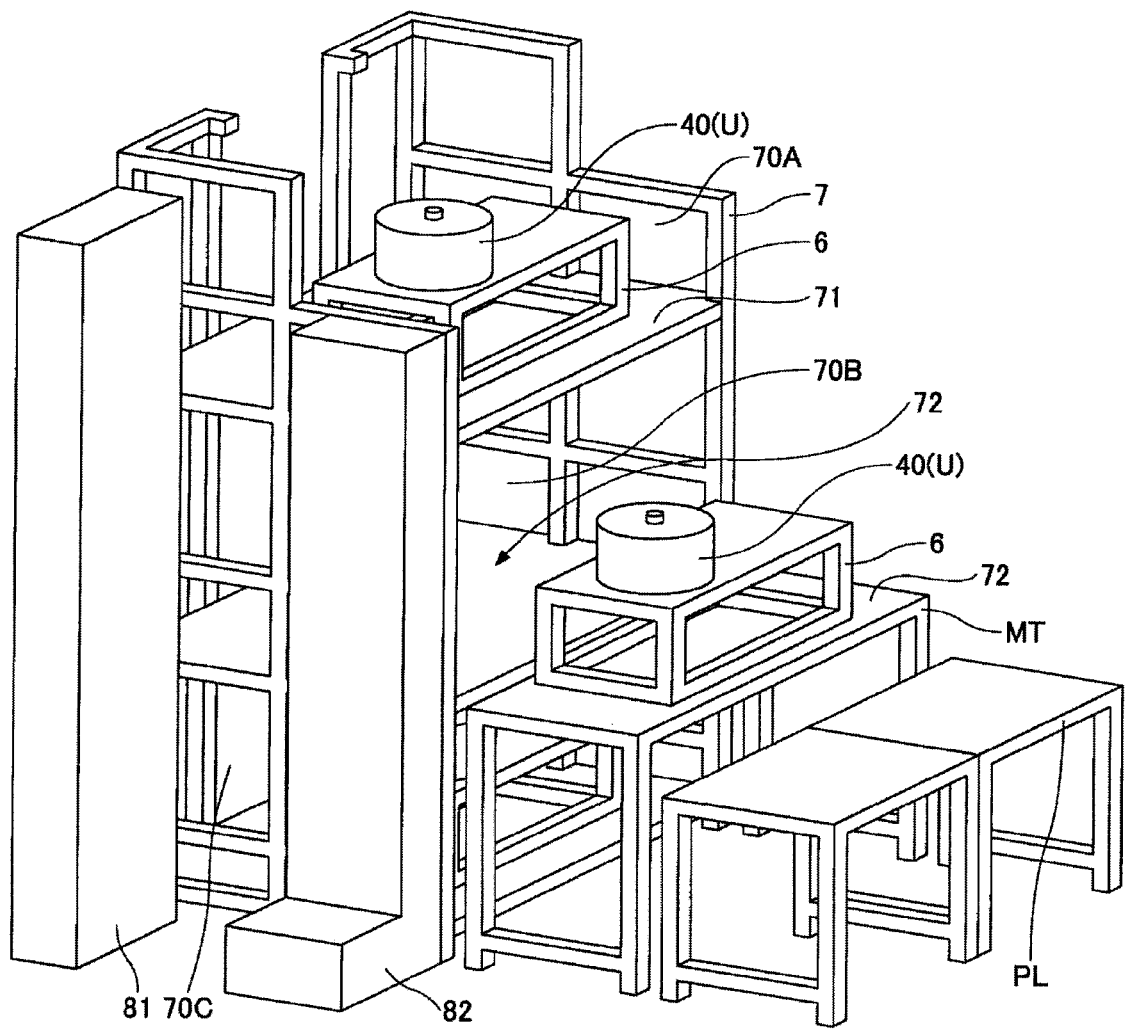
FIG. 9 is a perspective view showing a state of the substrate processing device according to the embodiment at the time of maintenance.

For example, as shown in FIG. 9, the outer frame 7 has a shelf structure in which shelves 71 and 72 are disposed at a frame body of a frame structure while being vertically spaced apart from each other. In the outer frame 7, a space between a bottom surface of the substrate processing unit 12 and the lower shelf 72, a space between the lower shelf 72 and the upper shelf 71, and a space above the upper shelf 71 serve as accommodating spaces 70A to 70C accommodating the processing units U, respectively.

The number of accommodating stages of the processing units U in the outer frame 7 where the processing units U are arranged in multiple stages along the vertical direction is not limited to three as shown in FIG. 9, and may be two or more than four. The number of the outer frames 7 arranged at the side surface 22 of the substrate transfer chamber 20 is not limited to three as shown in FIG. 2, and may be two or more than four.

In addition, one outer frame 7 may be directly connected to the EFEM 10. In this case, the EFEM 10 corresponds to the substrate transfer chamber, and the transfer mechanism corresponds to the substrate transfer mechanism.

As shown in FIG. 2, each of the processing units U includes a processing chamber 40 for processing a wafer under a vacuum atmosphere, and a load-lock chamber 30 connected to the processing chamber 40 and having an inner atmosphere switched between the atmospheric atmosphere and the vacuum atmosphere. The processing unit U is connected to the substrate transfer chamber 20 through the load-lock chamber 30. Each of the processing units U includes two processing chambers 40A and 40B. Wafers are transferred from the two processing chambers 40A and 40B to the substrate transfer chamber 20 through the load-lock chamber 30.

As shown in FIGS. 2 and 3, the load-lock chamber 30 has a pentagonal planar shape and has therein a substrate transfer mechanism 32. The load-lock chamber 30 is provided with a transfer port 31 through which a wafer is loaded into and unloaded out. A connection port 34 is disposed at one side surface of the load-lock chamber 30, and a gate valve G1 for opening and closing the transfer port 31 is disposed at an inner side of the connection port 34.

As shown in FIG. 4, the connection unit 23 is disposed at the side surface 22 of the substrate transfer chamber 20, and the connection port 34 on the load-lock chamber 30 side is connected to the connection unit 23. An interlock mechanism 36 serving as a safety device at the time of releasing the connection between the connection port 34 and the connection unit 23 is disposed below the connection unit 23 (see, e.g., FIG. 7).

Transfer ports 35 that can be opened and closed by gate valves G2 and G3, respectively, are disposed at two surfaces on a rear side of the load-lock chamber 30 when viewed from the surface of the load-lock chamber 30 connected to the substrate transfer chamber 20. A processing chamber 40 is airtightly connected to the side surface of the load-lock chamber 30 where each of the transfer ports 35 is disposed.

A gas exhaust line (not shown) is connected to the load-lock chamber 30. By evacuating the inside of the load-lock chamber 30 through the gas exhaust line, the atmosphere in the load-lock chamber 30 can be switched between the atmospheric atmosphere of a normal pressure (normal pressure atmosphere) and the vacuum atmosphere. The substrate transfer mechanism 32 disposed in the load-lock chamber 30 is, e.g., a multi-joint arm that is extendable/contractible and rotatable about the vertical axis. The substrate transfer mechanism 32 transfers a wafer between the substrate transfer chamber 20 and the processing chamber 40.

In the processing chamber 40, vacuum processing such as film formation or the like can be performed on the wafer. The processing chamber 40 is provided with a mounting table for mounting thereon a wafer as a processing target, various processing gas supply units (not shown) for supplying a processing gas for film formation into the processing chamber 40, a plasma generation mechanism (not shown) for performing film formation using plasma, and the like.

As shown in FIG. 3 and FIG. 9, the processing unit U configured as described above is supported from a bottom surface thereof by an inner frame 6 serving as the frame body of the frame structure. An inner space of the inner frame 6 (below the processing unit U) accommodates therein auxiliary devices (not shown) such as a driving mechanism for driving the substrate transfer mechanism 32 in the load-lock chamber 30, a transfer mechanism for transferring the wafer between the mounting table in the processing chamber 40 and the substrate transfer mechanism 32 on the load-lock chamber 30 side, and the like.

As shown in FIGS. 3 and 9, the processing units U are accommodated in the accommodating spaces 70A to 70C in the outer frame 7 while being supported by the inner frame 6, and the load-lock chamber 30 of each of the processing units U is connected to the substrate transfer chamber 20. Accordingly, in the substrate processing device of the present embodiment, a total number of eighteen processing units U accommodated in six outer frames 7 are connected to the substrate transfer chamber 20, and thirty-six processing chambers 40 are used for performing film formation on wafers.

As shown in FIG. 3, a gas box 81 for supplying various processing gases for film formation or a purge gas for discharging unnecessary processing gases to the processing chamber 40 of each processing unit U is disposed at a left side of the outer frame 7 when viewed towards the substrate transfer chamber 20. A power supply box 82 for supplying power to various driving devices, the plasma generation mechanism, and the like in the load-lock chamber 30 or the processing chamber 40 is disposed at a rear side of the gas box 81 when viewed towards the substrate transfer chamber 20.

In the substrate processing device of the present embodiment, the gas box 81 and the power supply box 82 are shared by the processing units U (three processing units U in this example) accommodated in multiple stages in each outer frame 7. As shown in FIG. 2, the gas box 81 and the power supply box 82 are disposed at the side portion of each outer frame 7 disposed in the substrate processing unit 12.

Here, as shown in FIG. 2, the arrangement positions of the gas box 81 and the power supply box 82 may be set to be the same on all outer frames 7. Accordingly, the structures and the arrangement paths of the supply lines for the processing gases supplied from the gas box 81 to the processing chamber 40 and the supply lines for the power supplied from the power supply box 82 to the load-lock chamber 30 and the processing chamber 40 may be set to be the same in all the processing units U.

In this manner, since the layouts of the outer frames 7, the gas boxes 81 and the power supply boxes 82, and the layouts of the load-lock chambers 30 and the processing chambers 40 in the processing unit U are the same as each other, it is possible to obtain a substrate processing device having the same structure for all of the load-lock chambers 30, the processing chambers 40, the outer frames 7, and the inner frames 6.

In the substrate processing device of the present embodiment, as shown in FIGS. 2 and 9, the arrangement layout of the three outer frames 7 and the arrangement layout of the oppositely disposed other three outer frames 7 with the substrate transfer chamber 20 provided therebetween, and the arrangement layout of the gas boxes 81 and the power supply boxes 82 respectively attached to the six outer frames 7 are rotationally symmetrical with respect to the substrate transfer chamber 20.

In addition to the gas box 81 and the power supply box 82, a cleaning gas supply unit for supplying cleaning gas for dry-cleaning the inside of each processing chamber 40 is disposed above the processing unit U accommodated in the uppermost accommodating space 70A of the outer frame 7. However, the description of the cleaning gas supply unit is omitted in this example.

A moving mechanism (not shown) is disposed between the outer frame 7 and the inner frame 6. In each of the accommodating spaces 70A to 70C, the processing units U (the load-lock chambers 30 and processing chambers 40) supported by the inner frame 6 can be moved integrally in a horizontal direction.

In each processing unit U, the number of the processing chambers 40 connected to the load-lock chamber 30 is not limited to two, and may be three or more. Further, each processing unit U may be provided with two load-lock chambers 30 respectively connected to processing chambers 40A and 40B. In addition, the processing unit U may include one load-lock chamber 30 and one processing chamber 40.

The type of the processing performed in the processing chamber 40 of the processing unit U is not limited to film formation, and may be etching, asking, annealing, or the like.

Figure 7:
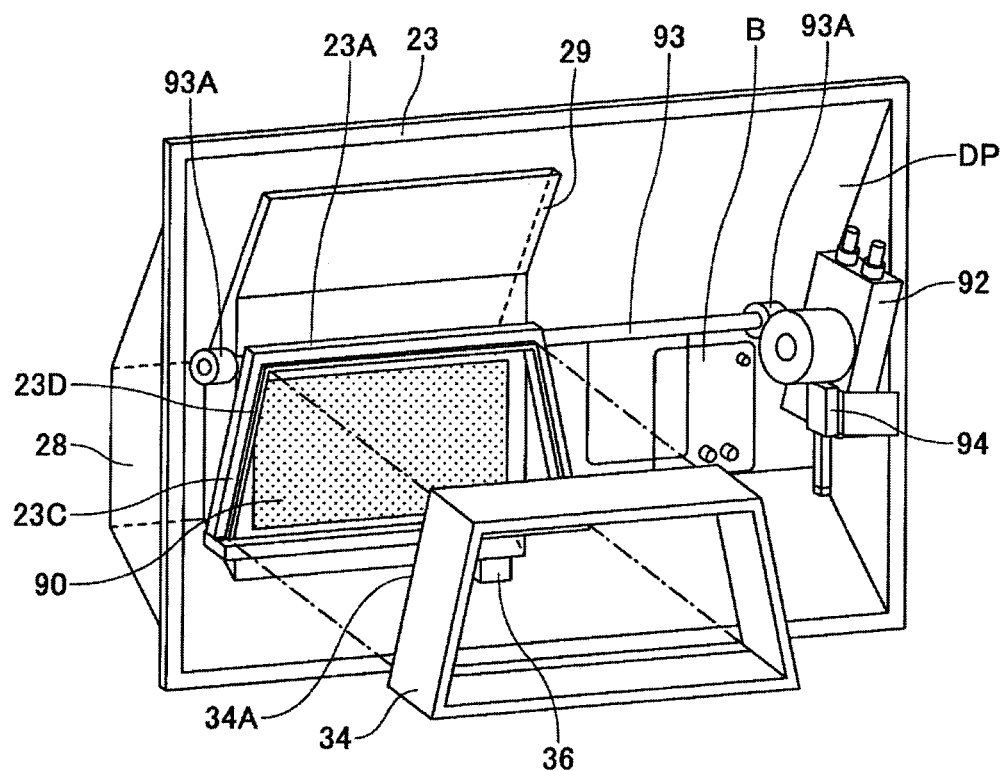
FIG. 7 is a perspective view of the connection unit of the substrate processing device according to the embodiment when viewed from the processing unit side.

As shown in FIG. 7, the connection port 34 is disposed at a leading side of the load-lock chamber 30 that is connected to the substrate transfer chamber 20. The connection port 34 is a tubular member having a trapezoidal shape when viewed from a front side, the trapezoidal shape of which the upper side is shorter than the lower side and of which both lateral sides are inclined.

The connection unit 23 is disposed between the substrate transfer chamber 20 and the load-lock chamber 30 of each processing unit U. The connection unit 23 connects the substrate transfer chamber 20 and the load-lock chamber 30 of each processing unit U such that the processing unit U can be detachably attached. In other words, each processing unit U is attached to the substrate transfer chamber 20 by connecting the load-lock chamber 30 of the processing unit U to the connection unit 23, and the attachment of each processing unit U to the substrate transfer chamber 20 is released by separating the load-lock chamber 30 of the processing unit U from the connection unit 23.

The connection unit 23 has an opening 23A. The opening 23A allows the substrate transfer chamber 20 to communicate with the load-lock chamber 30. The shape and the size of the opening 23A are not particularly limited. The opening 23A has the shape and the size that allows the wafer to be transferred between the substrate transfer chamber 20 and the processing unit U.

In the present embodiment, as shown in FIG. 7, the opening 23A has a frame formed in an isosceles trapezoidal shape when viewed from the front side to correspond to the connection port 34 on the load-lock chamber 30 side. A wafer loading/unloading port is opened at an inner side of the opening 23A. Specifically, the opening 23A has a stepped portion to be fitted to the inner portions of the upper side and the inclined lateral sides of the connection port 34. Further, a member on the lower side of the opening 23A protrudes toward the connection port 34 such that a member on the lower side of the connection port 34 can be mounted on the upper surface of the member on the lower side of the opening 23A.

The connection unit 23 is provided with an opening/closing mechanism 90 for opening and closing the opening 23A. The opening/closing mechanism 90 opens and closes the opening 23A. The opening/closing mechanism 90 is not particularly limited as long as the opening 23A can be opened and closed. The opening/closing mechanism 90 allows the wafer to be transferred between the substrate transfer chamber 20 and the processing unit U when the opening 23A is opened, and prevents the wafer from being transferred between the substrate transfer chamber 20 and the process when the opening 23A is closed.

The opening 23A and the opening/closing mechanism 90 are examples of the opening and the opening and closing mechanism in the substrate processing device of the present invention, respectively.

The substrate processing device of this example further includes a control unit (not shown). The control unit is a computer having a central processing unit (CPU) and a storage unit. The storage unit stores a program including steps (commands) for controlling contents of film formation performed in the processing chamber 40 of each processing unit U, a wafer transfer sequence in the substrate transfer chamber, or the like. This program is stored in a storage medium such as a hard disk, a compact disk, a magnet optical disk, a memory card, or the like, and can be installed in a computer therefrom.

Next, an operation of the substrate processing device will be described. As shown in FIG. 2 and the like, during normal operation of the substrate processing device, the processing units U are accommodated in the accommodating spaces 70A to 70C of each of the outer frames 7 while being supported by the respective inner frames 6, and the load-lock chamber 30 of each of the processing units U is connected to the substrate transfer chamber 20.

When the carrier C accommodating wafers serving as processing targets is mounted on the load port 11 of the EFEM 10, the wafers are taken out of the carrier C and transferred to the substrate transfer mechanism of the substrate transfer chamber 20 by the transfer mechanism. When a predetermined number of wafers are received by the substrate transfer mechanism of the substrate transfer chamber 20, the substrate transfer mechanism is moved to a position where the processing unit U for performing film formation on the wafers is accommodated. Then, the open front surface of the housing of the substrate transfer mechanism is directed toward the processing unit U, and a height position of the wafer to be transferred is adjusted to a wafer transferable height at which the wafer can be transferred to the substrate transfer mechanism 32 in the load-lock chamber 30 in the processing unit U.

In the processing unit U, the gate valve G1 on the substrate transfer chamber 20 side is opened in a state where the load-lock chamber 30 is under normal pressure atmosphere, and the multi-joint arm of the substrate transfer mechanism 32 is extended to enter the substrate transfer chamber 20 so that the fork of the multi-joint arm of the substrate transfer mechanism 32 can be positioned below the wafer to be received. Then, the housing of the substrate transfer mechanism in the substrate transfer chamber 20 is lowered slightly so that the wafer can be transferred from the wafer holding member in the substrate transfer chamber 20 to the fork.

Prior to the above-described wafer transfer operation, the wafer on which the film formation is completed in the processing unit U may be transferred to an empty wafer holder of the substrate transfer mechanism in the substrate transfer chamber 20. The substrate transfer mechanism 32 that has received the wafer retracts the multi-joint arm thereof, and the gate valve G1 is closed to switch the atmosphere in the load-lock chamber 30 to the vacuum atmosphere.

Then, the gate valve G2 or the gate valve G3 of the processing chamber 40 is opened, and the wafer is loaded into the processing chamber 40 and subjected to the film formation. While the film formation is performed in one of the two processing chambers 40 in the processing unit U, the cleaning may be performed in the other processing chamber 40 by supplying a cleaning gas thereinto. Alternatively, the film formation may be performed on wafers at the same time in the two processing chambers 40.

The substrate transfer mechanism in the substrate transfer chamber 20 that has transferred the wafer to the predetermined processing unit U sequentially moves to other processing units U and transfers other wafers to perform film formation on the wafers. Accordingly, the film formation can be performed on the wafers in parallel in the plurality of processing units U in the substrate processing device.

When the film formation in the processing unit U is completed, the substrate transfer mechanism in the substrate transfer chamber 20 is moved to receive the wafer on which the film formation is completed from the processing unit U. When a predetermined number of wafers on which the film formation is completed are accommodated in the housing of the substrate transfer mechanism in the substrate transfer chamber 20, the substrate transfer mechanism in the substrate transfer chamber 20 is moved toward the EFEM 10 and returns the film formed wafers to the original carrier C in a reverse path to that used in the loading operation. Accordingly, a series of processes for the wafer is completed.

Next, the maintenance of each processing unit U will be described. First, the control unit performs a control of separating the processing unit U that is a maintenance target from a transfer destination of a wafer transferred by the substrate transfer mechanism of the substrate transfer chamber 20, and sets the inside of the load-lock chamber 30 to a normal pressure state and releases the vacuum state of the processing chamber 40 so that the processing chamber 40 can be opened. Further, the control unit can perform a control of continuously carrying out the processing of the wafer using a processing unit U that is not the maintenance target and arranged in another outer frame 7.

For the connection unit 23 to which the load-lock chamber 30 of the maintenance-target processing unit U is connected, the opening 23A is switched from an open state to a closed state by the opening/closing mechanism 90. Therefore, the opening 23A is closed by the opening/closing mechanism 90 (a shutter 91 to be described later) (see, e.g., FIGS. 4 and 5), and the processing unit U is ready for maintenance.

Figure 10:
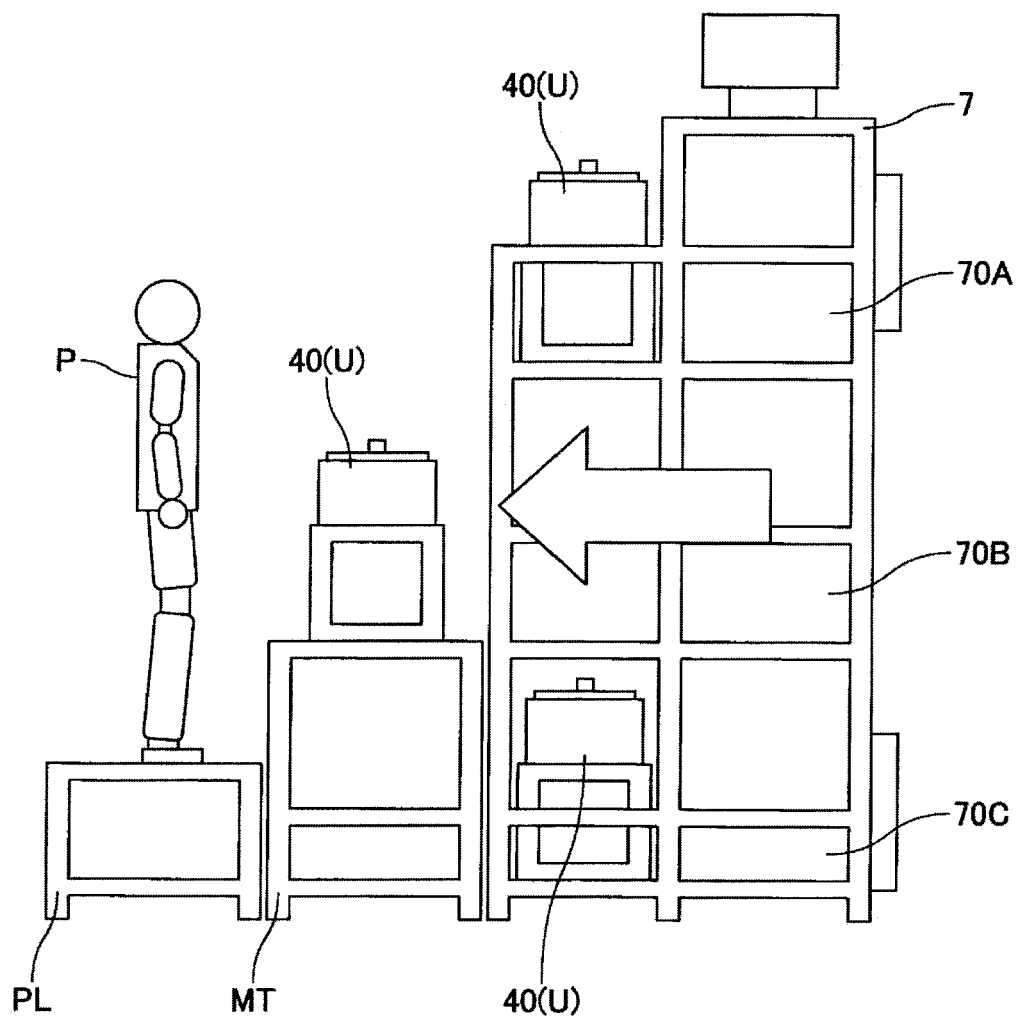
FIG. 10 is a side view showing the state of the substrate processing device according to the embodiment at the time of the maintenance.

When the predetermined processing unit U is ready for maintenance, an operator P prepares to open the processing chamber 40 in the processing unit U as shown in FIG. 10. At this time, in the substrate processing device of this example, preparation for maintenance varies depending on the positions of the accommodating spaces 70A to 70C accommodating the processing units U.

With respect to the processing unit U accommodated in the lowermost accommodating space 70C, various lines (not shown) are removed, and connection members (not shown) of the various lines are unfastened. Then, the inner frame 6 (the processing unit U) is raised using a jack or the like to remove the various lines. Next, the inner frame 6 and the processing unit U supported by the inner frame 6 are taken out in a direction away from the substrate transfer chamber 20. In this manner, the processing chamber 40 can be opened, and the operator P performs the desired maintenance.

With respect to the processing unit U accommodated in the intermediate accommodating space 70B, a mounting table MT for mounting thereon the inner frame 6 is disposed at a position where the processing unit U is taken out. A ceiling plate provided on an upper surface of the mounting table MT is disposed to allow a surface of the ceiling plate continuous with a surface of the shelf 72 on the outer frame 7 side. A moving mechanism (not shown) on the shelf 72 side is formed on the surface of the ceiling plate.

In a similar manner as the case of the lowermost processing unit U, the cleaning gas supply lines are removed and the connections of various lines are released. Then, the inner frame 6 (the processing unit U) is raised using a jack or the like. Next, the inner frame 6 and the processing unit U supported by the inner frame 6 are taken out in a direction away from the substrate transfer chamber by the moving mechanism for the ceiling plate of the mounting table MT and the shelf 72. As shown in FIG. 10, the operator P steps on a foot rest PL to open the processing chamber 40 and perform the desired maintenance.

With respect to the processing unit U accommodated in the uppermost accommodating space 70A, since no processing unit U is disposed above the processing unit U accommodated in the uppermost accommodating space 70A, direct access is available to the processing chamber 40 by separating a part of the housing accommodating the substrate processing unit and the cleaning gas supply lines. Therefore, the operator P steps on the foot rest PL to remove a part of the housing of the substrate processing unit 12 and open the processing chamber 40 without removing the processing unit U to perform the desired maintenance.

Next, an operation of connecting the processing unit U taken out of each of the accommodating spaces 70B and 70C to the substrate transfer chamber 20 will be described. First, upon the completion of the maintenance of the processing unit U that is taken out to a predetermined maintenance position separated from the substrate transfer chamber 20, the processing chamber 40 is closed.

Then, the inner frame 6 is moved along the moving mechanism of the shelf 72, and the inner frame 6 is moved back in a horizontal direction to a position where the load-lock chamber 30 is connected to the substrate transfer chamber 20, and more specifically, to a separation position located above the connection position where the load-lock chamber 30 is connected to the substrate transfer chamber 20. Thereafter, the inner frame 6 is lowered using a jack or the like to move the processing unit U to the connection position, and the connection port 34 of the load-lock chamber 30 and the opening 23A of the connection 23 are fitted to connect the load-lock chamber 30 to the substrate transfer chamber 20.

In the operation of lowering the inner frame 6 from the separation position to the connection position, when the inner frame 6 is moved to the separation position and lowered to the connection position, the positioning of the inner frame 6 with respect to the outer frame 7 is carried out by a guide mechanism (not shown) disposed between an inner surface of the frame member of the outer frame 7 and an outer surface of the frame member of the inner frame 6.

By lowering the inner frame 6 from the separation position to the connection position, the connection port 34 provided at the load-lock chamber 30 and the opening 23A on the connection unit 23 side are fitted as shown in a fitting structure to be described later, and the positioning in the forward/backward direction when viewed from the substrate transfer chamber 20 side is performed. The positioning of the connection port 34 and the connection unit 23 is performed using a pin (not shown).

At this time, by fitting the upper sides and the lower sides of the connection port 34 and the opening 23A, which extend in the horizontal direction, the connection port 34 and the opening 23A can be brought into close contact with each other during the operation of lowering the load-lock chamber 30. Further, by fitting both inclined lateral sides of the connection port 34 and the opening 23A, the connection port 34 and the opening 23A can be easily brought into close contact with each other during the operation of lowering the load-lock chamber 30. In contrast, when the connection port 34 and the opening 23A have both lateral sides (not inclined) extending in the vertical direction, it is difficult to bring the connection port 34 and the opening 23A into close contact with each other only by the operation of lowering the load-lock chamber 30 and also difficult to prevent the generation of particles due to friction therebetween.

When the processing unit U is disposed at the accurate connection position by the above-described configuration, various lines (not shown) are disposed at positions before the separation, and the processing unit U is ready for re-operation by fastening the connection members of the various lines. Although the inner frame 6 and the processing unit U accommodated in the intermediate accommodating space 70B are described in this example, the above-described operation can also be applied to the inner frame 6 and the processing unit U accommodated in the lowest housing space 70C.

In the present embodiment, by providing the opening/closing mechanism 90, the opening 23A can be closed during the maintenance of each processing unit U. Therefore, when each processing unit U is separated from the substrate transfer chamber 20 to be subjected to maintenance, the opening 23A can be closed and the inflow of particles into the substrate processing device during maintenance can be prevented. Further, since the opening 23A communicating with the processing unit U requiring maintenance can be closed during the maintenance of the processing unit U, the operation of the substrate processing device can be continued even during the maintenance of each processing unit U.

Figure 5:
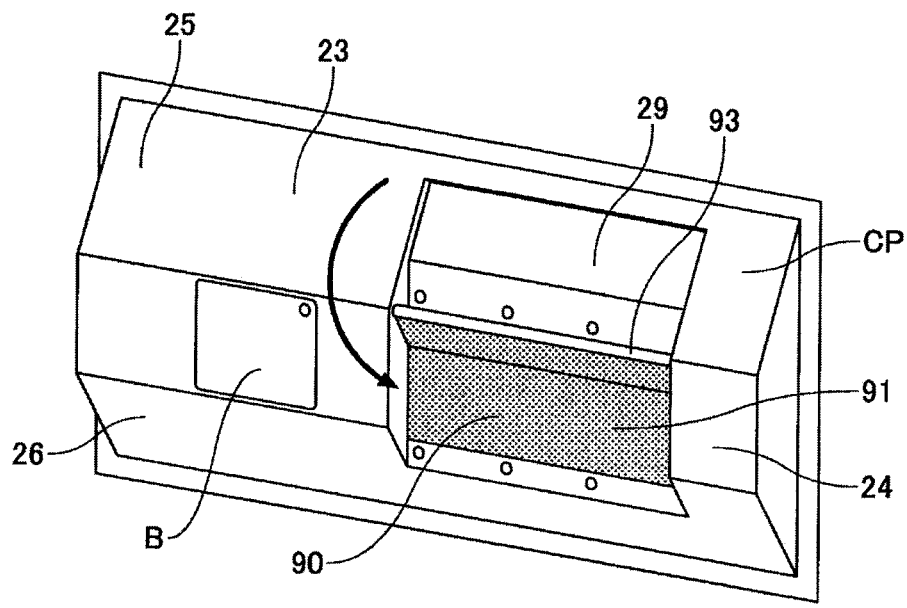
FIG. 5 is a perspective view of a connection unit (in a state where an opening is closed) of the substrate processing device according to the embodiment when viewed from the transfer chamber side.

In the present embodiment, as shown in FIGS. 4 and 5, the opening/closing mechanism 90 is provided with the shutter 91 for exposing or covering the opening 23A. The shape and the size of the shutter 91 are not particularly limited as long as the opening 23A can be covered. The shutter is preferably made of a material having stiffness such as metal or the like. By using such a shutter, the opening 23A can be reliably opened and closed.

In the present embodiment, as shown in FIGS. 4 to 7, the connection unit 23 has a convex portion CP projecting toward the substrate transfer chamber 20. The opening 23A is formed at a bottom portion 24 of the convex portion CP. A depressed portion DP is formed on the processing unit U side to correspond to the convex portion CP.

With this configuration, the connection portion between the processing unit U and the substrate transfer chamber 20 can be positioned at the inner side of the substrate transfer chamber 20. Therefore, the dimension of the substrate processing unit 12 can be reduced, and the footprint of the substrate processing device can also be reduced.

Figure 6:
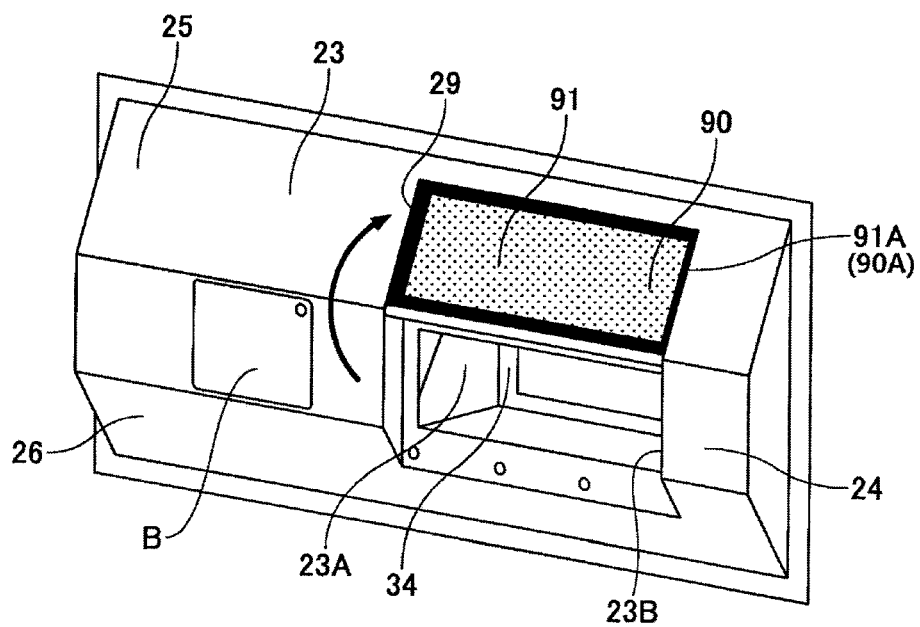
FIG. 6 is a perspective view of the connection unit (in a state where the opening is opened) of the substrate processing device according to the embodiment when viewed from the transfer chamber side.

In the present embodiment, as shown in FIGS. 4 to 6, the convex portion CP of the connection unit 23 has tapered inclined surfaces 25 and 26. As shown in FIG. 8B, the inclined surfaces 25 and 26 are inclined such that a height of a vertical cross section of the convex portion CP becomes gradually smaller from the side surface 22 of the substrate transfer chamber 20 toward the opening 23A. By providing the inclined surfaces 25 and 26, it is possible to prevent air flow from the fan filter unit F from being disturbed in the substrate transfer chamber 20 even when the opening/closing mechanism such as the shutter or the like is provided at the opening 23A.

Figure 8A:
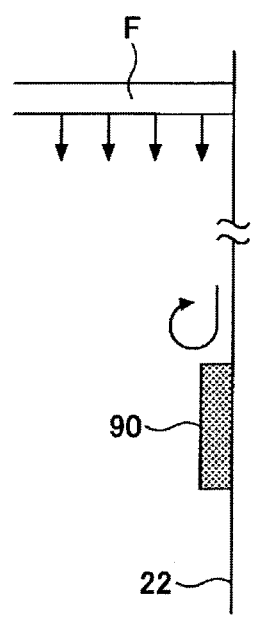
FIG. 8A shows a state where a shutter is directly attached to a side surface of a transfer unit.
Figure 8B:
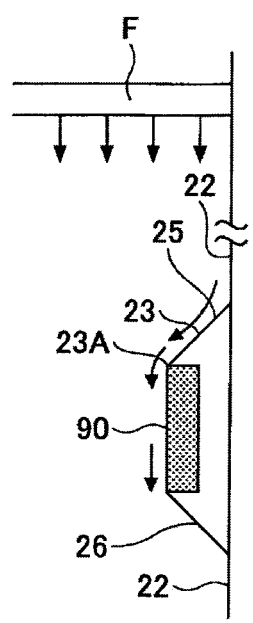
FIG. 8B shows a state where the shutter is attached to the side surface of the transfer unit through the connection unit.

Specifically, in an example of directly attaching the opening/closing mechanism such as the shutter or the like to the side surface of the substrate transfer chamber 20 as shown in FIG. 8A, turbulence is generated in the substrate transfer chamber 20 by the air flow from the fan filter unit F (see arrows in FIG. 8A). Therefore, particles are peeled off from the side surface of the substrate transfer chamber or the like, which may result in contamination of the wafer. On the other hand, in the example of installing the shutter 91 (the opening/closing mechanism 90) at the opening 23A provided at the connecting unit 23 having the inclined surfaces 25 and 26 as shown in FIG. 8B, turbulence is hardly generated in the substrate transfer chamber 20 (see arrows in FIG. 8B). Accordingly, it is possible to prevent the wafer from being contaminated by particles peeled off from the side surfaces of the substrate transfer chamber 20 or the like.

In the present embodiment, the shutter 91 has a sealing portion 91A. The sealing portion 91A is disposed at a peripheral portion 90A of the shutter 91 to be in close contact with an opening end 23B of the opening 23A when the opening 23A is closed. The material of the seal portion 91A is not particularly limited. However, sponge made of ethylene propylene rubber or the like may be used to allow the sealing portion 91A to be reliably in close contact with the opening end 23B of the opening 23A when the opening 23A is closed. By forming the sealing portion 91A at the shutter 91, the opening 23A can be sealed in a state where the opening 23A is closed by the shutter 91.

In the present embodiment, the shutter 91 is preferably disposed at an upper portion of the connecting unit 23 (on the inclined surface 25) or at a lower portion of the connecting unit 23 (on the inclined surface 26) when the opening 23A is opened. Since the shutter 91 is disposed on the inclined surface 25 or 26 when the opening 23A is opened, it is possible to prevent the shutter 91 from interfering with the wafer transferred in the substrate transfer chamber 20 or the wafer transferred between the substrate transfer chamber 20 and the load-lock chamber 30 through the opening 23A.

In the present embodiment, an accommodating portion (accommodating space) 29 accommodating the shutter 91 is formed on the inclined surface 25. The shutter 91 is accommodated in the accommodating portion 29 when the opening 23A is opened. By providing the accommodating portion 29, it is possible to reliably prevent the shutter 91 from interfering with the wafer during the operation of the substrate processing device. Further, by accommodating the shutter 91 in the accommodating portion 29 when the opening 23A is opened, it is possible to prevent the air flow from being disturbed in the substrate transfer chamber 20 by the shutter 91 disposed on the inclined surface of the connecting unit 23.

In the present embodiment, the opening/closing mechanism 90 is provided with a rotation mechanism 92 for rotating the shutter or the like. The arrangement position of the rotation mechanism 92 is not particularly limited. However, the rotation mechanism 92 is preferably arranged at the depressed portion DP side (processing unit U side) of the connection unit to prevent interference with the wafer transferred in the substrate transfer chamber 20 or the transfer mechanism. Although the rotation mechanism 92 is not particularly limited, a motor, a rotary actuator, or the like may be used as the rotation mechanism 92 due to ease of installation on the shutter 91 and ease of opening/closing operation.

For example, the rotary actuator 92 may be arranged at a portion in the depressed portion DP of the connection unit 23, excluding a portion where the opening 23A is arranged, to avoid interference with a wafer to be transferred. The shutter 91 is fixed to a rotation shaft 93 of the rotary actuator 92, and can be rotated by the rotation of the rotary actuator 92. As shown in FIG. 7, a through-hole into which the rotation shaft 93 is inserted is formed on a side surface of the opening end 23B of the opening 23A, and a sealing member 93A such as an O-ring or the like is formed at a gap between the through-hole and the rotation shaft 93.

An interlock mechanism 94 serving as a safety device during the driving of the rotation shaft 93 is disposed below the rotary actuator 92. Further, the connection unit 23 is provided with a working hole used for installing the rotary actuator 92 or performing maintenance. The working hole is closed by a lid B when the installation of the rotary actuator 92 or the like is not performed.

In the present embodiment, as shown in FIG. 7, the connection unit 23 has a fitted portion (fitted surface) 23C to which a fitting portion (fitting surface) 34A of the load-lock chamber 30 (the connection port 34) is fitted. In other words, the load-lock chamber 30 and the connection unit 23 are connected by the fitting structure of the fitting portion 34A and the fitted portion 23C. With this fitting structure, the positioning of the load-lock chamber 30 and the connection unit 23 become easier, and the load-lock chamber 30 and the connection unit 23 can be reliably connected.

The fitted portion 23C of the connection unit 23 is provided with a sealing portion 23D. The sealing portion 23D is disposed at the fitted portion 23C of the connection unit 23 to be in close contact with the fitting portion 34A of the load-lock chamber 30 in a state where the load-lock chamber 30 is connected to the connection unit 23. The material of the sealing portion 23D is not particularly limited. However, similar to the sealing portion 91A of the shutter 91, sponge made of ethylene propylene rubber or the like may be used. By providing the sealing portion 23D at the connection unit 23, the load-lock chamber 30 and the connection unit 23 can be brought into close contact with each other.

In the present embodiment, as shown in FIGS. 9 and 10, the processing units U are arranged in multiple stages along the vertical direction of the substrate transfer chamber 20. By arranging the processing units U in multiple stages, the throughput of the substrate processing device can be increased without increasing the footprint.

In the case of arranging the processing units U in multiple stages, when the maintenance of the processing unit disposed on the upper stage is performed, particles may fall from the upper processing unit toward the lower processing unit in the substrate transfer chamber 20 and contaminate the wafers processed by the lower processing unit U or the inside of the lower processing unit. However, in the present embodiment, the opening 23A can be closed during the maintenance of the upper processing unit, which makes it possible to prevent particles from falling from the upper processing unit that is being subjected to maintenance toward the lower processing unit that is not being subjected to maintenance.

Figure 11:
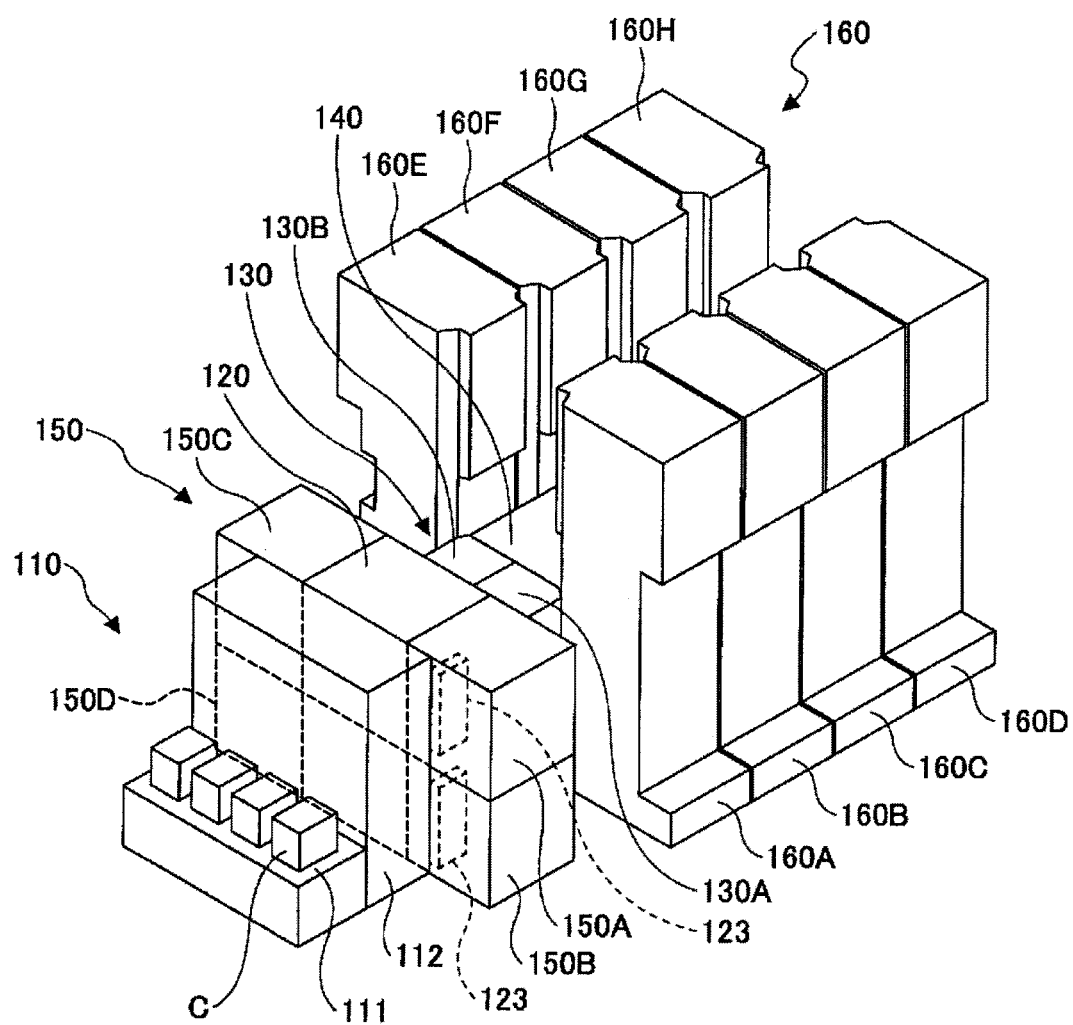
FIG. 11 is a perspective view showing an exemplary appearance of a substrate processing device according to another embodiment of the present invention.
Figure 12:
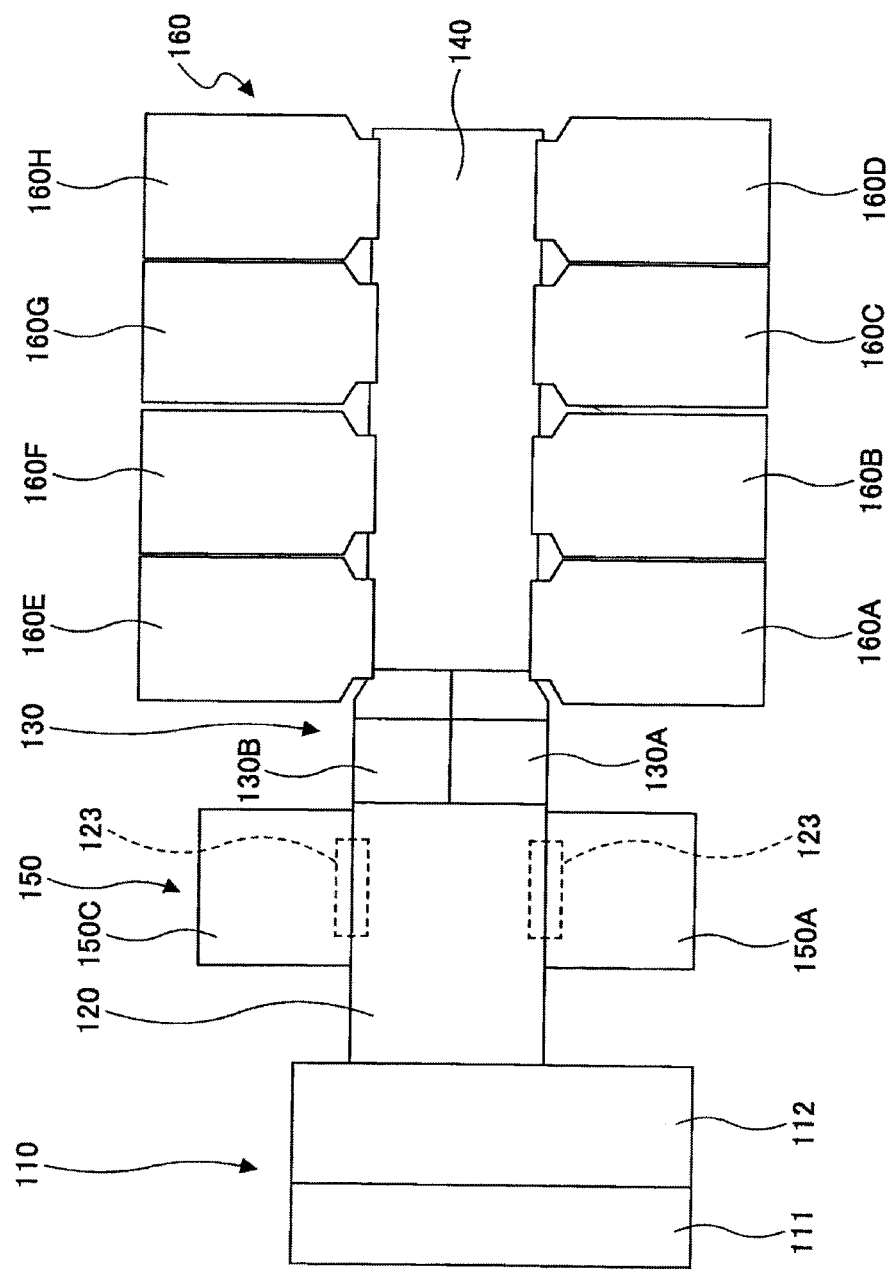
FIG. 12 is a plan view showing the example of the substrate processing device according to another embodiment of the present invention.

Next, a configuration of a substrate processing device according to another embodiment of the present invention will be described. FIG. 11 is a perspective view showing an exemplary appearance of the substrate processing device according to another embodiment of the present invention. FIG. 12 is a plan view showing an example of the substrate processing device according to another embodiment of the present invention.

As shown in FIG. 11, the substrate processing device according to another embodiment of the present invention includes an EFEM 110, an atmosphere transfer chamber 120, a load-lock chamber 130, a vacuum transfer chamber 140, a first processing unit 150, and a second processing unit 160.

The EFEM 110 includes a load port 111 on which a carrier C as a transfer container accommodating a plurality of wafers is mounted. The EFEM 100 is connected to the atmosphere transfer chamber 120. The EFEM 110 includes a transfer chamber 112 having a transfer mechanism (not shown) for transferring a wafer from the load port 111 to the atmosphere transfer chamber 120. For example, a fan filter unit (not shown) is disposed at a position near an upper surface of the transfer chamber 112, and the inside of the transfer chamber 112 is under a clean air atmosphere (e.g., an inert gas atmosphere) of a positive pressure. The EFEM 110 transfers the wafer received from the carrier C to the atmosphere transfer chamber 120 using the transfer mechanism.

The atmosphere transfer chamber 120 is connected to the transfer chamber 112 of the EFEM 110. The atmosphere transfer chamber 120 has a substantially rectangular parallelepiped shape and has the same height as that of the EFEM 110. The load-lock chamber 130 (e.g., two load-lock chambers 130A and 130B) is connected to a side of the atmosphere transfer chamber 120 that is opposite to a side facing EFEM 110. The first processing unit 150 having, e.g., four processing units 150A, 150B, 150C, and 150D is connected to a side of the atmosphere transfer chamber 120 where the EFEM 110 and the load-lock chamber 130 are not connected. The atmosphere transfer chamber 120 has a transfer mechanism (not shown) for transferring a wafer between the EFEM 110, the load-lock chamber 130, and the first processing unit 150. The structure of the transfer mechanism is not limited as long as it can transfer the wafer between the EFEM 110, the load-lock chamber 130, and the first processing unit 150. The transfer mechanism may have, e.g., one or more multi-joint arms. A fan filter unit (not shown) is disposed at a position near the upper surface of the atmosphere transfer chamber 120, and the inside of the atmospheric transfer chamber 120 is under clean air atmosphere (e.g., inert gas atmosphere) of a positive pressure.

The load-lock chamber 130 is disposed between the atmosphere transfer chamber 120 and the vacuum transfer chamber 140. The load-lock chamber 130 is an internal pressure variable chamber of which the inner atmosphere can be switched between an atmospheric atmosphere of a normal pressure (normal pressure atmosphere) and a vacuum atmosphere. A mounting table (not shown) for mounting thereon a wafer is disposed in the load-lock chamber 130. When the wafer is transferred from the atmosphere transfer chamber 120 to the vacuum transfer chamber 140, the wafer is transferred to the load-lock chamber maintained under the atmospheric atmosphere. Then, the inner atmosphere of the load-lock chamber 130 is switched to the vacuum atmosphere and the wafer is transferred to the vacuum chamber 140. On the other hand, when the wafer is transferred from the vacuum transfer chamber 140 to the atmospheric transfer chamber 120, the wafer is transferred to the load-lock chamber 130 maintained under the vacuum atmosphere. Then, the inner atmosphere of the load-lock chamber 130 is switched to the atmospheric atmosphere, and the wafer is transferred to the atmospheric transfer chamber 120. An openable/closable gate valve (not shown) is provided between the load-lock chamber 130 and the atmosphere transfer chamber 120. Further, an openable/closable gate valve (not shown) is provided between the load-lock chamber 130 and the vacuum transfer chamber 140.

The vacuum transfer chamber 140 has a substantially rectangular planar shape. The vacuum transfer chamber 140 is a vacuum chamber having therein a transfer mechanism (not shown) for transferring a wafer between the load-lock chamber 130 and the second processing unit 160 having, e.g., eight processing units 160A to 160H. The structure of the transfer mechanism is not limited as long as it can transfer the wafer between the load-lock chamber 130 and the second processing unit 160. The transfer mechanism may include a traveling rail forming a moving path extending along the longitudinal direction of the vacuum transfer chamber 140 at the bottom portion of the vacuum transfer chamber 140, a support column capable of moving in the longitudinal direction while being guided by the traveling rail, and one or more multi-joint arms disposed at the support column.

The first processing unit 150 is connected to the atmosphere transfer chamber 120. In the example shown in FIGS. 11 and 12, the first processing unit 150 includes two processing units 150A and 150B arranged in two stages in a height direction at one side surface of the atmosphere transfer chamber 120 where the EFEM 110 and the load-lock chamber 130 are not connected, and two processing units 150C and 150D arranged in two stages in the height direction at the other side surface. However, the number of first processing units 150 is not limited to four, and may be three or less, or five or more. The first processing unit 150 has a processing chamber (not shown) for performing atmospheric processing such as cleaning, post-processing, film thickness measuring, or the like on the wafer under the atmospheric atmosphere.

A connection unit 123 is disposed between the atmosphere transfer chamber 120 and the processing chamber of the first processing unit 150. The connection unit 123 may have the same structure as that of the connection unit 23 described with reference to FIGS. 4 to 8. That is to say, the connection unit 123 is configured to connect the atmosphere transfer chamber 120 and the processing chamber of the first processing unit 150 such that the first processing unit 150 can be detachably attached. In other words, the first processing unit 150 is attached to the atmosphere transfer chamber 120 by connecting the processing chamber of the first processing unit 150 to the connection unit 123, and the attachment of the first processing unit 150 to the atmosphere transfer chamber 120 can be released by separating the processing chamber of the first processing unit 150 from the connection unit 123. Further, the connection unit 123 also has the opening 23A that allows the atmosphere transfer chamber 120 to communicate with the processing chamber of the first processing unit 150, and the opening/closing mechanism 90 for opening and closing the opening 23A (see, e.g., FIGS. 4 to 7).

The second processing unit 160 is connected to the vacuum transfer chamber 140. In the example shown in FIGS. 11 and 12, the second processing unit 160 includes four processing units 160A, 160B, 160C and 160D connected to one side surface in the longitudinal direction of the vacuum transfer chamber 140, and four processing units 160E, 160F, 160G, and 160H connected to the other side surface. However, the number of the second processing units 160 is not limited to eight, and may be seven or less, or nine or more. In addition, the second processing units 160 may be arranged in multiple stages in the height direction as in the case of the above-described processing units U. The second processing unit 160 has a processing chamber (not shown) for performing vacuum processing such as film formation, etching, or the like on the wafer under the vacuum atmosphere. The processing chamber includes a mounting table for mounting thereon a wafer as a processing target, various processing gas supply units for supplying processing gases for film formation or etching into the processing chamber, a plasma generation mechanism for performing film formation using plasma, or the like (all not shown). Further, an openable/closable gate valve (not shown) is provided between the second processing unit 160 and the vacuum transfer chamber 140.

In accordance with the substrate processing device according to another embodiment of the present invention, the same effect as that of the embodiment described with reference to FIGS. 1 to 10 can be obtained.

While the embodiments of the present invention have been described, the present invention is not limited to the above-described embodiments, and can be variously changed and modified within the scope of the present invention.

This application claims priority to Japanese Patent Application No. 2017-059814, filed on Mar. 24, 2017, the entire contents of which are incorporated herein by reference.

DESCRIPTION OF REFERENCE NUMERALS

U: processing unit
20: substrate transfer chamber
23: connection unit
23A: opening
25: inclined surface
29: accommodating portion
30: load-lock chamber
34: connection port
40: processing chamber
90: opening/closing mechanism
91: shutter
91A: sealing portion
92: rotary actuator

The invention claimed is:

1. A substrate processing device comprising:
a transfer chamber configured to transfer a substrate received from an equipment front end module (EFEM) under an atmospheric atmosphere;
a plurality of processing units each including at least one processing chamber for processing the substrate under a vacuum atmosphere and at least one load-lock chamber connected to the processing chamber to switch an inner atmosphere thereof between the atmospheric atmosphere and the vacuum atmosphere, and
a fan filter unit disposed at an upper surface of the transfer chamber,
wherein the transfer chamber has a connection unit configured to connect the transfer chamber and the load-lock chamber, and each of the processing units is detachably attached to the transfer chamber by the connection unit, and
the connection unit includes:
an opening that allows the transfer chamber to communicate with the load-lock chamber; and
an opening/closing mechanism configured to open or close the opening,
wherein the connection unit has a convex portion projecting from a side surface of the transfer chamber towards inside of the transfer chamber,
the opening is formed at a crest portion of the convex portion, and
the convex portion has two tapered inclined surfaces which are inclined such that a height of a vertical cross section of the convex portion becomes smaller from the side surface of the transfer chamber toward the opening, the crest portion being arranged between the two tapered inclined surfaces, and
the two tapered inclined surfaces prevent air flow from the fan filter unit from being disturbed in the transfer chamber.

2. The substrate processing device of claim 1, wherein the opening/closing mechanism has a shutter configured to expose or cover the opening.

3. The substrate processing device of claim 2, wherein the shutter is disposed on one of the inclined surfaces when the opening is opened.

4. The substrate processing device of claim 3, wherein an accommodating space is provided at the one of the inclined surfaces to accommodate the shutter when the opening is opened.

5. The substrate processing device of claim 2, wherein the opening/closing mechanism has a rotation mechanism configured to rotate the shutter.

6. The substrate processing device of claim 2, wherein the shutter has a sealing portion that is disposed at a peripheral portion of the shutter and brought into close contact with an opening end of the opening when the opening is closed.

7. The substrate processing device of claim 1, wherein the connection unit has a fitted surface to which a fitting surface of the load-lock chamber is fitted, and
the fitted surface has a sealing portion that is brought into close contact with the fitting surface.

8. The substrate processing device of claim 1, wherein the processing units are arranged in multiple stages along a vertical direction of the transfer chamber.

9. A substrate processing device comprising:
- a transfer chamber configured to transfer a substrate received from an equipment front end module (EFEM) under an atmospheric atmosphere;
- a plurality of processing units each including at least one processing chamber for processing the substrate, and
- a fan filter unit disposed at an upper surface of the transfer chamber,
- wherein the transfer chamber has a connection unit configured to connect the transfer chamber and the processing chamber, and each of the processing units is detachably attached to the transfer chamber by the connection unit, and
- the connection unit includes an opening that allows the transfer chamber to communicate with the processing chamber, and an opening/closing mechanism configured to open or close the opening,
- wherein the connection unit has a convex portion projecting from a side surface of the transfer chamber towards inside of the transfer chamber,
- the opening is formed at a crest portion of the convex portion, and
- the convex portion has two tapered inclined surfaces which are inclined such that a height of a vertical cross section of the convex portion becomes smaller from the side surface of the transfer chamber toward the opening, the crest portion being arranged between the two tapered inclined surfaces, and
- the two tapered inclined surfaces prevent air flow from the fan filter unit from being disturbed in the transfer chamber.

* * * * *